United States Patent [19]

Oka et al.

[11] 4,286,173
[45] Aug. 25, 1981

[54] LOGICAL CIRCUIT HAVING BYPASS CIRCUIT

[75] Inventors: Yuichi Oka; Yosimitsu Takiguchi, both of Hadano, Japan

[73] Assignee: Hitachi, Ltd., Tokyo, Japan

[21] Appl. No.: 22,949

[22] Filed: Mar. 22, 1979

[30] Foreign Application Priority Data

Mar. 27, 1978 [JP] Japan .................................. 53-34199
Jul. 14, 1978 [JP] Japan .................................. 53-85101

[51] Int. Cl.³ .................... H03K 19/00; H03K 17/00; H03K 13/32
[52] U.S. Cl. ................................. 307/440; 307/242; 328/152; 324/73 R
[58] Field of Search ............... 307/208, 213, 218, 242, 307/303, 203; 328/96, 97, 152, 154; 324/73 R

[56] References Cited

U.S. PATENT DOCUMENTS

| | | | |
|---|---|---|---|
| 3,800,233 | 3/1974 | Sauthier | 307/218 X |
| 3,924,144 | 12/1975 | Hadamard | 324/73 R |
| 4,055,754 | 9/1977 | Chesley | 324/73 R |
| 4,176,258 | 11/1979 | Jackson | 324/73 R |

Primary Examiner—John Zazworsky
Attorney, Agent, or Firm—Craig and Antonelli

[57] ABSTRACT

The logical circuit includes therein a logic block for performing a logical function. The logic block is connected with the selection circuit and the selection circuit selects the input signals thereto in response to the selection signal. The input terminals of the logic block are connected with a bypass circuit and the bypass circuit transmits the input signals applied to the input terminals of the logic block to the selection circuit. When the selection signal takes the selected one of the values, the input signals to the logic block are bypassed through the bypass circuit, without being passed through the logic circuit, and delivered as the outputs of the selection circuit.

15 Claims, 7 Drawing Figures ic circuit having a
bypass circuit which performs a digital or analog operation and more particularly to a digital logical circuit having a high density of integration and capable of performing logical functions.

Various kinds of logical circuits are interconnected with each other and mounted on a base board such that desired logical functions may be performed. In general, logical circuits are of integrated circuit configuration. Logical circuits are usually tested as follows. Namely, test data or test patterns are previously prepared in manual or automatic mode and the test data or patterns are successively supplied to the logical circuits. The tests are completed by comparing the actual outputs of the logical circuits with the theoretically calculated expected values of the outputs of the logical circuits.

However, as the integration density of a logical circuit becomes high and as the circuit configuration thereof becomes complicated, the fabrication of test patterns for examining the functions of a base board with logical circuits interconnected with one another and mounted thereon becomes more and more difficult. It is generally said that there is a relation such that $$y = kx^2,$$

where x is the number of the gates in an integrated circuit to be fabricated and y the time required to fabricate the IC (hereafter the term "integrated circuit" is shortened for brevity as such). This explicitly shows that the increase in the number of gates in the IC, that is, in the complexity of the IC configuration, leads directly to an exponential increase in the time required for the fabrication of test patterns for the IC. Although such a logical circuit as a binary counter performs only simple logical functions, it may assume as many possible states as $2^a$ if it has a bits. Thus, it is not easy to prepare test patterns for the binary counter and also the test thereof takes a considerable time. Publicity is sometimes given to logical circuits which the makers disclose with their functions and specifications alone but not with concrete equivalent circuits. It is therefore impossible to prepare test patterns for such logical circuits since no equivalent circuit can be deduced from the merely abstract scheme disclosed. The complicated IC is necessarily accompanied by an increase in the cost of fabricating the test patterns therefor or by the difficulty in developing it into an equivalent circuit. And this most often causes the designer to give up the fabrication of test patterns. If even only a piece of a complicated IC is mounted along with other simple ICs on a base-board, it becomes difficult to fabricate test patterns for examining the complicated IC and also test patterns for inspecting the ICs adjacent to the complicated one. In a base board with a complicated IC and relatively simple ICs, the logical values of the output of the IC forming the stage just previous to the complicated IC is prevented by the complicated IC from being delivered as the base board output, and the complicated IC prevents the logical values of the output thereof from being set in the IC forming the stage just after the complicated IC.

As described above, a base board having at least a complicated IC, besides other relatively simple ICs, mounted thereon has a drawback that the tests for not only the complicated IC but also the adjacent ICs are difficult.

A technique for individually testing the ICs mounted on a base board is disclosed in, for example, the specification of the U.S. Pat. No. 3,789,205 entitled "Method of Testing MOSFET Planar Boards," R. L. James. According to the testing method invented by James, the ICs adjacent to the complicated IC(s) can be individually tested. However, this method cannot be applied to the test of the functions of the whole system, i.e. integral combination of a multiplicity of ICs.

SUMMARY OF THE INVENTION

One object of this invention is to provide a logical circuit the testing of which is easy and the test patterns for which can be simply fabricated.

Another object of this invention is to provide a logical circuit apparatus capable of easily testing the functions of a part of the logical circuits so interconnected with one another as to perform logical functions.

A logical circuit according to this invention comprises a circuit means having an input means and performing logical functions, a selection means connected with the circuit means and a transmission means for transmitting signals from the input means to the selection means. The selection means selects the input thereto in response to the selection signals.

In one of the operating modes, the selection means selects the outputs of the circuit means. In this case, the output signals of the circuit means produced through its logical functions are delivered by the selection means. In accordance with another operating mode, the selection means selects the output signals of the transmission means. In this case, the signals having passed through the transmission means are delivered from the selection means. If the last operating mode is selected in the test in the case where the circuit means is complicated, the input signals can be passed through the transmission means, without being passed through the complicated circuit means. Thus, the input signals to the present logical circuit can be delivered from the selection means as the output signals of the present logical circuit, without being passed through the circuit means, so that the signals intended for tests will not be blocked by the present logical circuit.

DESCRIPTION OF THE PREFERRED EMBODIMENTS

This invention will be described in detail with the aid of FIG. 1. A logical circuit 100 includes therein a logic block 101 having input lines 102 and 103 and output lines 104 and 105. The logic block 101 is constituted of arbitrary circuits to perform desired functions. One example of the logic block is a synchronous 4-bit up-/down counter disclosed on p.p. 7-306 to 7-307 of "The TTL Data Book for Design Engineers," 2nd Edition, published by TEXAS INSTRUMENTS INC., 1976. The number of input lines and the number of output lines depend on the circuit configuration of the logic block. In the case of the embodiment shown in FIG. 1, they are equal to each other, that is, there are two input lines and two output lines. In general, there are more than two input and output lines. The above cited synchronous 4-bit up/down counter has a logic block with input/output lines the number of which is different from that of the input/output lines of the logic block shown in FIG. 1. This is because the circuit in FIG. 1 is simplified as a model so as to facilitate the understanding of this invention.

Figure 1:
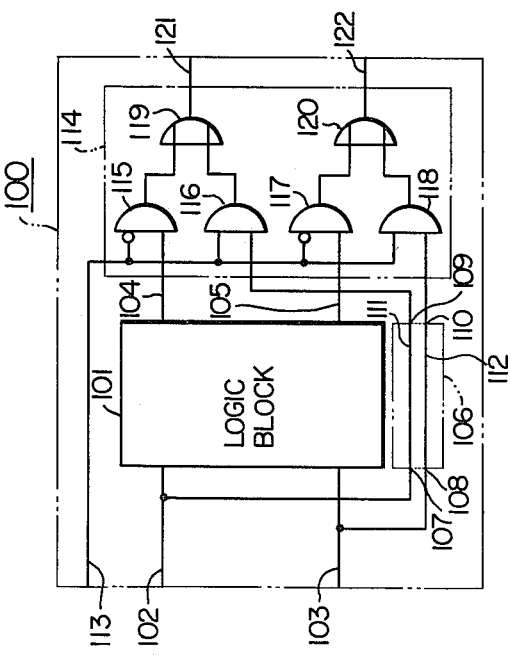
FIG. 1 shows a logical circuit as an embodiment of this invention.

As seen in FIG. 1, the output lines 104 and 105 are connected with a selection circuit 114 described later. The input lines 102 and 103 are connected with the input terminals 107 and 108 of a transmission circuit 106. The transmission circuit 106 has also output terminals 109 and 110. The input terminal 107 is connected with the output terminal 109 by wire 111 while the input terminal 108 is connected with the output terminal 110 by wire 112. Therefore, the transmission circuit 106 connects the input lines 102 and 103 directly with the selection circuit 114 so as to transmit signals from the input lines 102 and 103 to the selection circuit 114.

The selection circuit 114 includes therein AND gates 115 to 118 and OR gates 119 and 120. Each of the AND gates 115 to 118 has two input terminals one of which is connected with the selection line 113. It is noted, however, that the AND gates 115 and 117 receive the inverted versions of the input signal on the input line 113. The remaining input terminals of the AND gates 115 and 117 are connected respectively with the output lines 104 and 105 of the logic block 101. The remaining input terminals of the AND gates 116 and 118 are connected respectively with the output terminals 109 and 110 of the transmission circuit 106. The outputs of the AND gates 115 and 116 are received by the OR gate 119 and the output of the OR gate 119 is delivered as an output through an output line 121. The outputs of the AND gates 117 and 118 are received by the OR gate 120 and the output of the OR gate 120 is delivered as an output through an output line 122.

The selection signal supplied through the selection signal line 113 may assume two logical levels, i.e. high and low levels. If the selection signal is at the low level, the AND gates 115 and 117 open to cause the output signals of the logic block 101 to be selected and to be delivered through the output lines 121 and 122. On the other hand, when the selection signal is at the high level, the AND gates 116 and 118 open to cause the outputs of the transmission circuit 106 to be selected and to be delivered through the output lines 121 and 122. In this way, when the selection signal supplied through the line 113 takes the low level, the outputs obtained as a result of the processing of the input signals supplied through the input lines 102 and 103 through the logical functions of the logic block 101 are respectively delivered through the output lines 121 and 122 as the outputs of the logical circuit 100. And when the selection signal takes the high level, on the other hand, the transmission circuit 106 functions as a bypass circuit for the logic block 101 so that the input signals supplied through the input lines 102 and 103 are guided directly to the output lines 121 and 122 where they appear as the output signals of the logical circuit 100.

The logical circuit 100 may take a form of an integrated circuit configuration as shown enclosed by a long-and-short-dash line.

Figure 7:
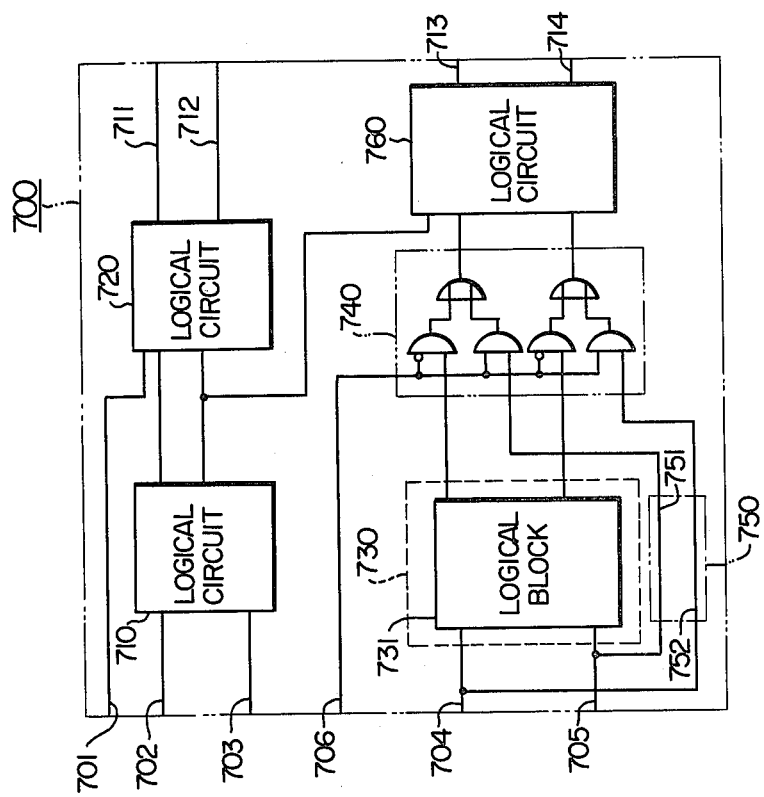
FIGS. 6 and 7 show logical circuit apparatuses as another embodiment of this invention.
Figure 5:
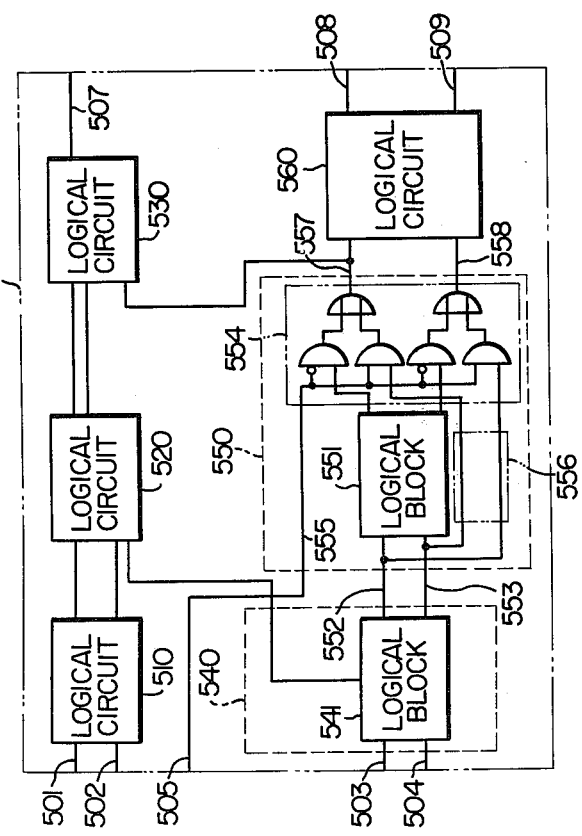
FIG. 5 shows a circuit of a logical circuit apparatus as an embodiment of this invention in which plural logical circuits are mounted on a base board.
Figure 6:
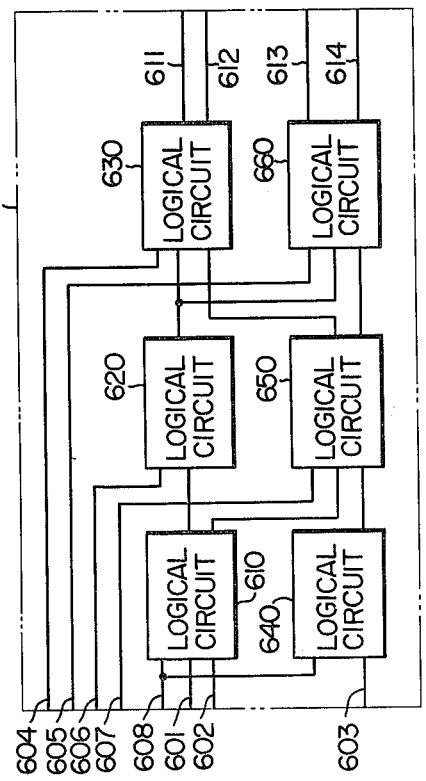

In case where the logic block 101 is a specifically complicated circuit, the provision of the transmission circuit as shown in FIG. 1 is very useful for the test of the logical circuit 100, as is explained in detail with FIGS. 5 to 7.

Figure 2:
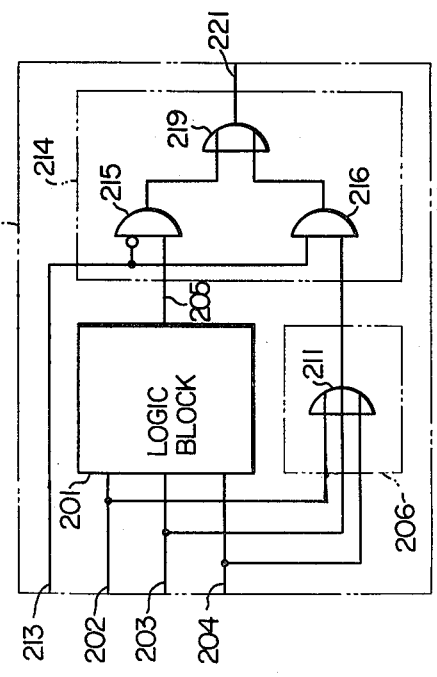

FIG. 2 shows a logical circuit as a second embodiment of this invention. A logical circuit 200 includes therein a logic block 201 having input lines 202 to 204 and an output line 205. The logic block 201 has the same logical functions as the logic block 101 in FIG. 1, having a similar circuit configuration except that the number of the input lines is larger than that of the output lines. The circuit configuration of the logic block shown in FIG. 1 or 2 is not the matter to which this invention is applied and therefore the explanation thereof will be omitted. This will be same in the logic blocks mentioned hereafter.

As seen in FIG. 2, an output line 205 is connected with a selection circuit 214. A transmission circuit 206 has an OR gate 211 which in turn has its input terminals connected respectively with input lines 202 to 204 and its output terminals connected with the selection circuit 214. The number of the output terminals of the transmission circuit 206 is equal to that of the output terminals of the logic block 201.

The selection circuit 214 includes therein AND gates 215, 216 and an OR gate 219 and serves to select one of the signals delivered from the logic block 201 and the transmission circuit 206 in response to the selection signal supplied through a selection signal line 213. In the case of this embodiment, when the selection signal on the line 213 takes the high level, the logical OR of the input signals on the input lines 202 to 204 is formed and finally delivered through the output line 221. The logical circuit 200 may also be in the form of an integrated circuit configuration as shown enclosed by a long-and-short-dash line in FIG. 2.

Figure 3:
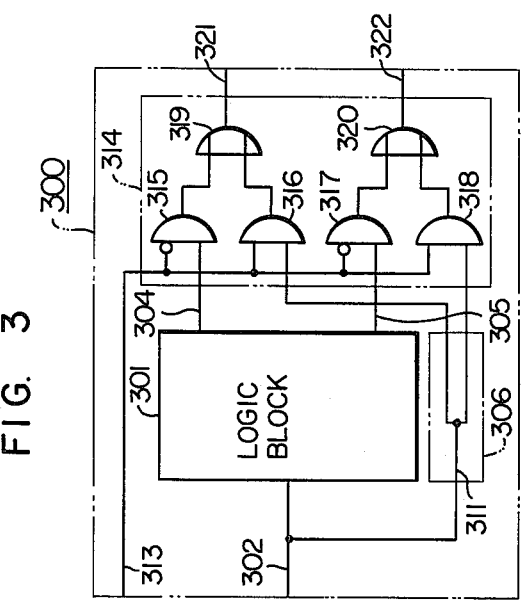
FIGS. 2, 3 and 4 show logical circuits as other embodiments of this invention.

FIG. 3 shows a logical circuit as a third embodiment of this invention. A logical circuit 300 includes therein a logic block 301 having an input line 302 and output lines 304 and 305. The logic block 301 has the same functions as the logic block 101 in FIG. 1, having a similar circuit configuration except that the number of the output lines is larger than that of the input lines. The output lines 304 and 305 are connected with the selection circuit 314. A transmission circuit 306 comprises wire 311 whose output end is bifurcated. The number of the output terminals of the transmission circuit 306 connected with the selection circuit 314 is equal to that of the output terminals of the logic block 301. The configuration of the selection circuit 314 is the same as the selection circuit 114 shown in FIG. 1. In this embodiment, when the selection signal supplied through the selection signal line 313 is at the high level, the same signals as that supplied through the input line 302 and passed through the wire 311 are delivered through the output lines 321 and 322.

Figure 4:
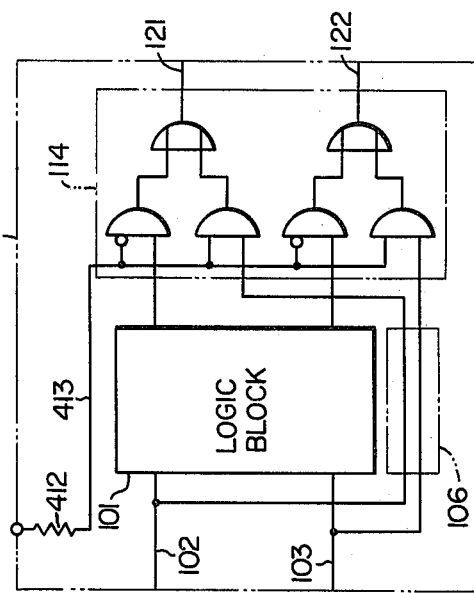

FIG. 4 shows a logical circuit as a fourth embodiment of this invention. A logical circuit 400 comprises a logic block 101, a transmission circuit 106 and a selection circuit 114 that are the same as those shown in FIG. 1. The logical circuit 400 differs from the logical circuit 101 shown in FIG. 1 only in that a selection signal line 413 is connected through a resistor 412 with a constant voltage source, e.g., a voltage source of +5 V. Thus, the selection signal having the high level is supplied to line 413. Accordingly, the selection circuit 114 selects the signal from the transmission circuit 106 so that the input signals on the input lines 102 and 103 are delivered onto the output lines 121 and 122 via the transmission circuit 106 serving as a bypass circuit for the logic block 101. When the line 413 is disconnected from the +5 V voltage source, e.g., by disconnecting the resistor 412 from the circuit, the selection circuit 114 selects the signal from the logic block 101.

Now, logical circuit apparatuses as embodiments of this invention will be described.

FIG. 5 shows a logical circuit apparatus in which logical circuits 510, 520, 530, 540, 550 and 560 are mounted on a base board (base member) 500. The base board 500 has input lines 501 to 505 and output lines 507 to 509. The logical circuits 510, 520, 530, 540, 550 and 560 perform their proper logical functions and are connected with the input and the output lines and also interconnected with one another in such a manner that desired logic functions are performed. Each of the logical circuits may be in the form of an IC configuration. Each of the logical circuits 510, 520, 530, 540 and 560 includes therein a logic block for performing a desired logical function, as typically shown with a logic block 541 in the logical circuit 540. The logical circuit 550 has the same circuit configuration as the logical circuit 100 shown in FIG. 1, comprising a logic block 551 having input lines 552 and 553, a selection circuit 554 coupled to a logic block 551 and having output lines 557 and 558, and a transmission circuit 556. The selection circuit 554 selects one of the outputs of the logic block 551 and the output of the transmission circuit 556 in response to the selection signal on the selection signal line 555.

At the time of testing the logical circuits mounted on the base board 500, test pattern signals are supplied to the input lines 501 to 504 of the base board 500 and the selection signal having the high level is supplied to the input line 505. In general, the test is made to ascertain the proper logical functions of the logical circuits mounted on the base board, whether individually or synthetically, and to locate the faults of the logical circuits or the parts of each logical circuit, if there are any. The test pattern signals are so composed as to meet the requirements of the test. Such a test itself is well-known and disclosed in, for example, "FAULT DIAGNOSIS OF DIGITAL SYSTEMS," H. Y. Chang, E. Manning and G. Metze, John Wiley & Sons, Inc. 1970.

According to the embodiment shown in FIG. 5, the output signal of the logical circuit 540 can be supplied to the logical circuits 530 and 560 through the transmission circuit 556, without being passed through the logic block 551. In the case where the logic block 551 of the logical circuit 550 has a complicated configuration, the absence of the transmission circuit 556 necessarily causes the output signal of the logical circuit 540 to pass through the complicated logic block 551 so that the composition of the test pattern signals become difficult or the test itself becomes impossible. Especially, by providing a transmission circuit for a logical circuit having a complicated configuration, the tests of the surrounding logical circuits can be facilitated. In this case, the complicated logical circuit is not subjected to test, but it is assumed that such a special logical circuit has been strictly tested before the mounting thereof on the base board.

The configuration of the logical circuit 550 shown in FIG. 5 may be the same as that of the logical circuit shown in FIG. 2 or 3.

FIG. 6 shows a logical circuit apparatus as another embodiment of this invention, in which plural logical circuits 610, 620, 630, 640, 650 and 660 are mounted on a base board 600. The base board 600 has input lines 601 to 608 and output lines 611 to 614. All the logical circuits have a configuration similar to that of the logical circuit 550 shown in FIG. 5. Accordingly, the input lines 604 to 608 serve to supply the selection signal to the respective logical circuits. Each logical circuit may take the form of an IC configuration.

The logical circuit apparatus shown in FIG. 6 is adapted to separately test the individual logical circuits. Now, let it be assumed to test only the logical circuit 620. Then, the selection signal having the high level is applied to the lines 604, 605, 607 and 608, the selection signal having the low level is applied to the line 606, and a number of desired test pattern signals are supplied to the lines 601 to 603. Accordingly, in the logical circuits except the logical circuit 620, the bypassed signal is selected so that the logical circuit 620 can be selectively tested, with it mounted on the base board.

FIG. 7 shows a logical circuit apparatus as another embodiment of this invention, in which integrated circuits 710, 720, 730, 740 and 760 mounted on a base board are so interconnected with one another as to perform desired logical functions. As the integrated circuit 730 includes therein a logic block 731, so other integrated circuits 710, 720 and 760 include therein logic blocks, each performing a logical function. The integrated circuit 740 has the same function as the selection circuit 554 shown in FIG. 5. The input lines 704 and 705 are connected with the integrated circuit 740 serving as a selection circuit via the wires 751 and 752 of the transmission circuit 750 serving as a bypass circuit. The transmission circuit 750 may be included in the integrated circuit 730.

In the embodiment shown in FIG. 7, by supplying the selection signal having the high level to the line 706 and desired test pattern signals to the lines 701 to 705, the test pattern signals on the lines 704 and 705 are transmitted to the integrated circuit 760 through the transmission circuit 750. Thus, the integrated circuits surrounding the integrated circuit 730 can be tested without affecting the operation of the circuit 730.

It is needless to say that this invention is by no means limited only to the embodiments described above but that various alterations, variations or modifications are possible within the scope of this invention.

We claim:

1. A logical circuit comprising:
   circuit means for performing logical functions including input means for receiving input signals;
   selection means coupled to said circuit means for selecting input signals applied thereto in response to selection signals; and
   transmission means for transmitting signals from said input means to said selection means including gate means coupling said input means to said selection means.

2. A logical circuit of claim 1 wherein said gate means comprises at least one OR gate.

3. A logical circuit of claim 1 or 2 wherein said selection means includes means for supplying said selection signals.

4. A logical circuit comprising:

circuit means for performing logical functions and having input means and output means;

bypass means having input terminals connected to said input means and output terminals, for applying input signals received at said input terminals to said output terminals, including gate means connecting said input terminals to said output terminals; and selection means connected to said circuit means and said output terminals of said bypass means, for selecting output signals from said circuit means or output signals from said bypass means in response to selection signals.

5. A logical circuit of claim 4 wherein said gate means is an OR gate.

6. A logical circuit of claim 4 or 5 wherein the number of said output terminals is equal to the number of said output means of said circuit means.

7. A logical circuit apparatus comprising:
a base member;
a plurality of circuit means mounted on said base member, each of which performs logical functions and has an input means and an output means, the input means of a first one of said plurality of circuit means being interconnected with the output means of at least a second one of said plurality of circuit means so as to perform logical functions;
at least one selection means having output means, coupled to the output means of said second one of said plurality of circuit means, for selecting input signals inputted thereto in response to selection signals applied to said selection means; and
transmission means coupled to the input means of said second one of said plurality of circuit means and said selection means, for transmitting input signals applied to the input means of said second one of said circuit means to said selection means.

8. A logical circuit apparatus of claim 7 wherein each of said circuit means comprises an integrated circuit means.

9. A logical circuit apparatus of claim 7 wherein said circuit means and said transmission means are formed in an integrated circuit.

10. A logical circuit apparatus of claim 9 wherein said integrated circuit further includes said selection means.

11. A logical circuit apparatus of claim 7, 8, 9 or 10 wherein each of said transmission means comprises wires coupling said input means directly to said selection means.

12. A logical circuit apparatus of claim 7, 8, 9 or 10 wherein said transmission means includes gate means.

13. A logical circuit means of claim 7, 8, 9 or 10 wherein said transmission means comprises at least one OR gate.

14. A logical circuit apparatus comprising:
first means having an input means and an output means, said first means being designed to perform logical functions, and said input means being capable of receiving test pattern signals for purposes of placing said first means under test;
second means having an input means coupled to said output means of said first means, said second means being designed to perform logical functions;
selection means having an output means coupled to said second means, and for selecting input signals applied thereto in response to selection signals;
transmission means coupled to said input means of said second means and said selection means, and for transmitting output signals from said first means to said selection means; and
means for supplying said selection signals to said selection means to apply said output signals of said first means to said output means of said selection means through said transmission means.

15. A logical circuit apparatus comprising:
first means having an input means supplied with test pattern signals, said first means being designed to perform logical functions;
selection means having an output means, coupled to said first means, for selecting input signals applied thereto in response to selection signals;
transmission means coupled to said input means of said first means and said selection means, for transmitting input signals from the input means of said first means to said selection means including gate means coupling said input means of said first means to said selection means;
second means having an input means and an output means, said second means being designed so as to perform logical functions, and said input means being coupled to the output means of said selection means; and
means for supplying said selection signals to said selection means in order to output said test pattern signals of said input means of said first means to said output means of said selection means through said transmission means to place said second means under test.

* * * * *